US009324917B2

(12) United States Patent
Katsuno et al.

(10) Patent No.: US 9,324,917 B2
(45) Date of Patent: Apr. 26, 2016

(54) SEMICONDUCTOR LIGHT EMITTING DEVICE (75) Inventors: Hiroshi Katsuno, Tokyo (JP); Satoshi Mitsugi, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,520

(22) Filed: Aug. 31, 2012

(65) Prior Publication Data
US 2013/0234182 A1 Sep. 12, 2013

(30) Foreign Application Priority Data

Mar. 7, 2012 (JP) .................................. 2012-050955

(51) Int. Cl.
| H01L 33/00 | (2010.01) |
| H01L 33/40 | (2010.01) |
| H01L 33/20 | (2010.01) |
| H01L 33/58 | (2010.01) |
| H01L 33/38 | (2010.01) |
| H01L 33/44 | (2010.01) |

(52) U.S. Cl.
CPC .............. *H01L 33/405* (2013.01); *H01L 33/20* (2013.01); *H01L 33/38* (2013.01); *H01L 33/44* (2013.01); *H01L 33/58* (2013.01)

(58) Field of Classification Search
CPC ......... H01L 33/00; H01L 33/20; H01L 33/38; H01L 33/44; H01L 33/387
USPC .................................................. 257/98–100
See application file for complete search history.

(56) References Cited

U.S. PATENT DOCUMENTS

2010/0078656 A1* 4/2010 Seo et al. ........................ 257/88
2010/0163894 A1* 7/2010 Uemura et al. ................ 257/95
(Continued)

FOREIGN PATENT DOCUMENTS

| JP | 2008-47871 A | 2/2008 |
| JP | 2010-157579 | 7/2010 |
| JP | 2011-49322 | 3/2011 |
| WO | WO 03/065464 A1 | 8/2003 |

OTHER PUBLICATIONS

U.S. Appl. No. 13/222,302, filed Aug. 31, 2011, Hiroshi Katsuno, et al.

(Continued)

*Primary Examiner* — Mohsen Ahmadi
*Assistant Examiner* — Frederick B Hargrove
(74) *Attorney, Agent, or Firm* — Oblon, McClelland, Maier & Neustadt, L.L.P.

(57) ABSTRACT

According to one embodiment, a semiconductor light emitting device includes a first semiconductor layer, a second semiconductor layer, a light emitting layer, a bonding pad, a narrow wire electrode and a first insulating layer. The light emitting layer is provided between the first semiconductor layer and the second semiconductor layer and is in contact with the first semiconductor layer. The narrow wire electrode includes a first portion and a second portion. The first portion is provided on a surface of the first semiconductor layer not in contact with the light emitting layer and is in ohmic contact with the first semiconductor layer. The second portion is provided on the surface and located between the first portion and the bonding pad. The narrow wire electrode is electrically connected to the bonding pad. The first insulating layer is provided between the second portion and the first semiconductor layer.

16 Claims, 4 Drawing Sheets

(56) References Cited

U.S. PATENT DOCUMENTS

| | | | |
|---|---|---|---|
| 2011/0008922 A1* | 1/2011 | Emerson et al. | 438/38 |
| 2011/0062479 A1* | 3/2011 | Sugano et al. | 257/98 |
| 2011/0220911 A1* | 9/2011 | Katsuno et al. | 257/76 |
| 2013/0049060 A1* | 2/2013 | Yu et al. | 257/99 |

OTHER PUBLICATIONS

Japanese Office Action issued Jun. 27, 2014 in Patent Application No. 2012-050955 with English Translation.

U.S. Appl. No. 14/173,966, filed Feb. 6, 2014, Katsuno, et al.

* cited by examiner

SEMICONDUCTOR LIGHT EMITTING DEVICE

CROSS-REFERENCE TO RELATED APPLICATIONS

This application is based upon and claims the benefit of priority from the prior Japanese Patent Application No. 2012-050955, filed on Mar. 7, 2012; the entire contents of which are incorporated herein by reference.

FIELD

Embodiments described herein relate generally to a semiconductor light emitting device.

BACKGROUND

In a structure of a semiconductor light emitting device such as LED (light emitting diode), for instance, a crystal layer formed on a sapphire substrate is bonded to a conductive substrate, and then the sapphire substrate is removed (JP 2010-157579 A (Kokai)). In this structure, to increase the light extraction efficiency, unevenness is formed at the crystal layer surface exposed by removing the sapphire substrate. In such a semiconductor light emitting device, further improvement in the light extraction efficiency is desired.

DETAILED DESCRIPTION

According to one embodiment, a semiconductor light emitting device includes a first semiconductor layer of a first conductivity type, a second semiconductor layer of a second conductivity type, a light emitting layer, a bonding pad, a narrow wire electrode and a first insulating layer. The light emitting layer is provided between the first semiconductor layer and the second semiconductor layer and is in contact with the first semiconductor layer. The narrow wire electrode includes a first portion and a second portion. The first portion is provided on a surface of the first semiconductor layer not in contact with the light emitting layer. The first portion is in ohmic contact with the first semiconductor layer. The second portion is provided on the surface and located between the first portion and the bonding pad. The narrow wire electrode is electrically connected to the bonding pad. The first insulating layer is provided between the second portion and the first semiconductor layer.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

Figure 1A:
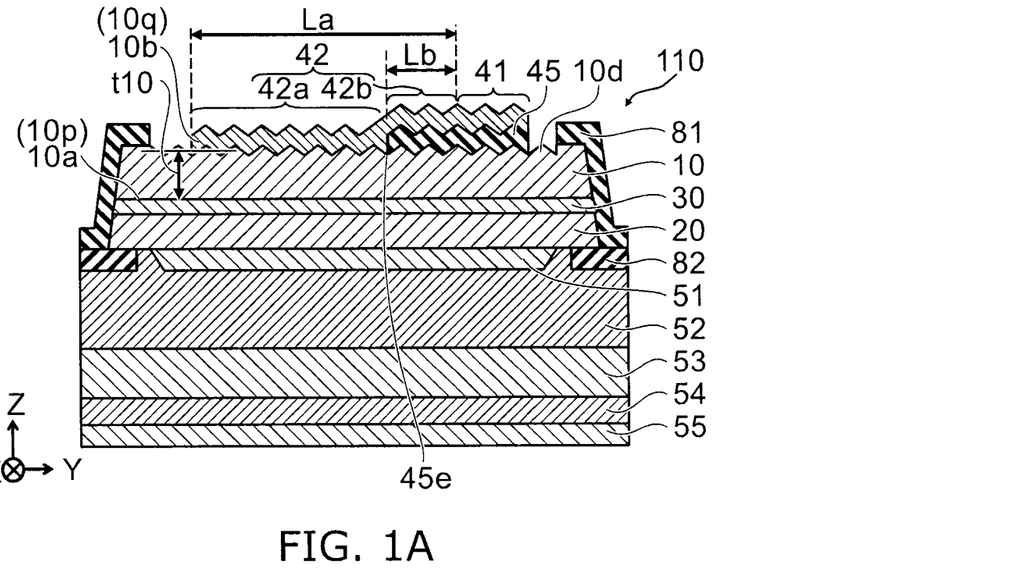
FIG. 1A and FIG. 1B are schematic views showing the configuration of a semiconductor light emitting device according to a first embodiment.
Figure 1B:
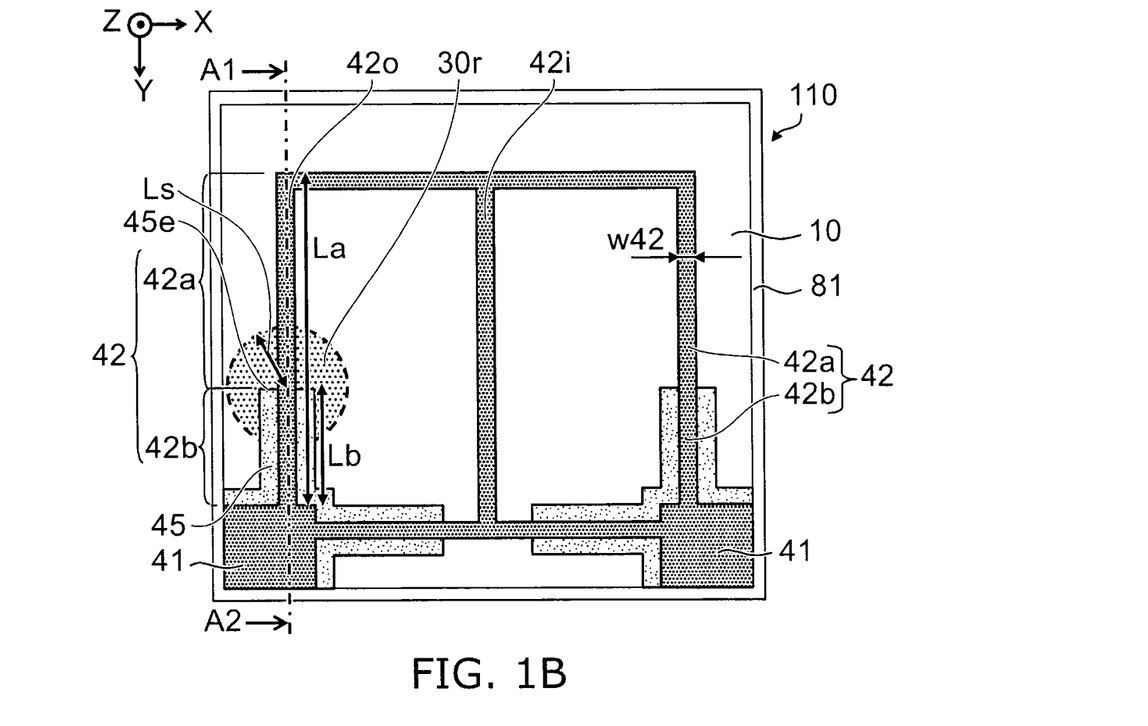

FIG. 1A and FIG. 1B are schematic views illustrating the configuration of a semiconductor light emitting device according to a first embodiment.

FIG. 1A is a sectional view taken along line A1-A2 of FIG. 1B. FIG. 1B is a plan view.

As shown in FIG. 1A and FIG. 1B, the semiconductor light emitting device 110 according to the embodiment includes a first semiconductor layer 10, a second semiconductor layer 20, a light emitting layer 30, a bonding pad 41, a narrow wire electrode 42, and a first insulating layer 45.

The first semiconductor layer 10 is of a first conductivity type. The second semiconductor layer 20 is of a second conductivity type. For instance, the first conductivity type is n-type, and the second conductivity type is p-type. Alternatively, the first conductivity type is p-type, and the second conductivity type is n-type. In the following description, it is assumed that the first conductivity type is n-type, and the second conductivity type is p-type.

The light emitting layer 30 is provided between the first semiconductor layer 10 and the second semiconductor layer 20. The light emitting layer 30 is in contact with the first semiconductor layer 10.

Here, the direction from the second semiconductor layer 20 toward the first semiconductor layer 10 is defined as Z-axis direction. One direction orthogonal to the Z-axis direction is defined as X-axis direction. The direction perpendicular to the Z-axis direction and the X-axis direction is defined as Y-axis direction. The Z-axis direction corresponds to the stacking direction of the second semiconductor layer 20, the light emitting layer 30, and the first semiconductor layer 10.

In the specification, the state of being stacked includes not only the state of two layers provided in contact with each other, but also the state of another layer interposed between the two layers.

In this example, the bonding pad 41 is provided on the first semiconductor layer 10.

In the specification, the state of a first layer provided on a second layer includes not only the state of the first layer being in contact with the second layer, but also the state of a third layer interposed between the first layer and the second layer.

As shown in FIG. 1A, the first semiconductor layer 10 has an opposed surface 10a (lower surface) opposed to the light emitting layer 30, and an opposite surface 10b (upper surface) on the opposite side from the opposed surface 10a. In this example, the opposed surface 10a is a surface 10p of the first semiconductor layer 10 in contact with the light emitting layer 30. The opposite surface 10b is a surface 10q of the first semiconductor layer 10 not in contact with the light emitting layer 30.

The bonding pad 41 is provided on the surface 10q (in this example, the opposite surface 10b) of the first semiconductor layer 10 not in contact with the light emitting layer 30.

As shown in FIG. 1B, in this example, two bonding pads 41 are provided. The embodiment is not limited thereto. The number of bonding pads 41 may be one, or three or more. In the following, attention is focused on one of a plurality of bonding pads.

As shown in FIG. 1A, the narrow wire electrode 42 is provided on the surface 10q (in this example, the opposite surface 10b) of the first semiconductor layer 10 not in contact with the light emitting layer 30. For instance, the narrow wire electrode 42 is juxtaposed with the bonding pad 41 in a plane parallel to the aforementioned surface 10q (in this example, the opposite surface 10b). The narrow wire electrode 42 is electrically connected to the bonding pad 41. The narrow wire electrode 42 corresponds to a first electrode electrically connected to the first semiconductor layer 10.

The narrow wire electrode 42 includes a first portion 42a and a second portion 42b. The first portion 42a is provided on the aforementioned surface 10q (in this example, the opposite surface 10b). The first portion 42a is in ohmic contact with the first semiconductor layer 10. The second portion 42b is provided on the aforementioned surface 10q (in this example, the opposite surface 10b). The second portion 42b is located between the first portion 42a and the bonding pad 41.

The first insulating layer 45 is provided between the second portion 42b and the first semiconductor layer 10. That is, the first portion 42a of the narrow wire electrode 42 is in ohmic contact with the first semiconductor layer 10. The second portion 42b of the narrow wire electrode 42 is substantially electrically isolated from the first semiconductor layer 10 by the first insulating layer 45. The first insulating layer 45 may not be a complete insulator. It is only necessary that the ratio of the value of current flowing from the first portion 42a to the first semiconductor layer 10 versus the value of current flowing from the second portion 42b to the first semiconductor layer 10 be large enough to avoid influence on the light emission distribution.

The semiconductor light emitting device 110 is e.g. an LED (light emitting diode). The first semiconductor layer 10, the second semiconductor layer 20, and the light emitting layer 30 can be made of e.g. a nitride semiconductor. The first semiconductor layer 10 contains e.g. n-type GaN. The second semiconductor layer 20 contains e.g. p-type GaN. The light emitting layer 30 can include e.g. a barrier layer containing GaN and a well layer containing InGaN. The peak wavelength of the light emitted from the light emitting layer 30 is e.g. 375 nanometers (nm) or more and 700 nm or less.

In this example, the light emitting layer 30 is placed between the narrow wire electrode 42 and the second semiconductor layer 20. The first semiconductor layer 10 is placed between the narrow wire electrode 42 and the light emitting layer 30. That is, the semiconductor light emitting device 110 is e.g. a vertically conducting LED. In this example, the bonding pad 41 is provided on the surface 10q (upper surface) of the first semiconductor layer 10 not in contact with the light emitting layer 30. In this example, the first insulating layer 45 is further provided between the bonding pad 41 and the first semiconductor layer 10.

As shown in FIG. 1B, in the case where a plurality of bonding pads 41 are provided, for instance, the narrow wire electrode 42 is connected to each bonding pad 41. For instance, as viewed along the Z-axis direction, the narrow wire electrode 42 can include an outer edge portion 42o along the outer edge of the first semiconductor layer 10, and an inside portion 42i inside the outer edge portion 42o. In this example, the outer edge portion 42o is connected to one bonding pad 41. In the following, attention is focused on one bonding pad 41 and the narrow wire electrode 42 (in this example, the outer edge portion 42o) connected to that bonding pad 41.

In the semiconductor light emitting device 110, the first insulating layer 45 is provided between the bonding pad 41 and the first semiconductor layer 10, and between the second portion 42b of the narrow wire electrode 42 and the first semiconductor layer 10. Thus, in the aforementioned opposite surface 10b of the first semiconductor layer 10, no substantial current is passed in the portion opposed to these regions. In the aforementioned opposite surface 10b of the first semiconductor layer 10, a current is injected into the portion opposed to the first portion 42a.

The current concentrates on the boundary between the first portion 42a and the second portion 42b and is injected into the first semiconductor layer 10. This current spreads in a certain range while passing through the first semiconductor layer 10. The current is injected into the light emitting layer 30 in an area larger than the injection spot at the boundary between the first portion 42a and the second portion 42b. Thus, light emission occurs in a large area.

Thus, as shown in FIG. 1B, the light emitting region 30r is e.g. a region having a certain area around the boundary between the first portion 42a and the second portion 42b.

The bonding pad 41 is made of a light blocking material such as metal. Here, in the semiconductor light emitting device 110, the boundary between the first portion 42a and the second portion 42b is spaced from the bonding pad 41. Thus, the light emitting region 30r does not overlap e.g. the bonding pad 41. Accordingly, light emission does not reach the bonding pad 41 and causes no loss.

Figure 2:
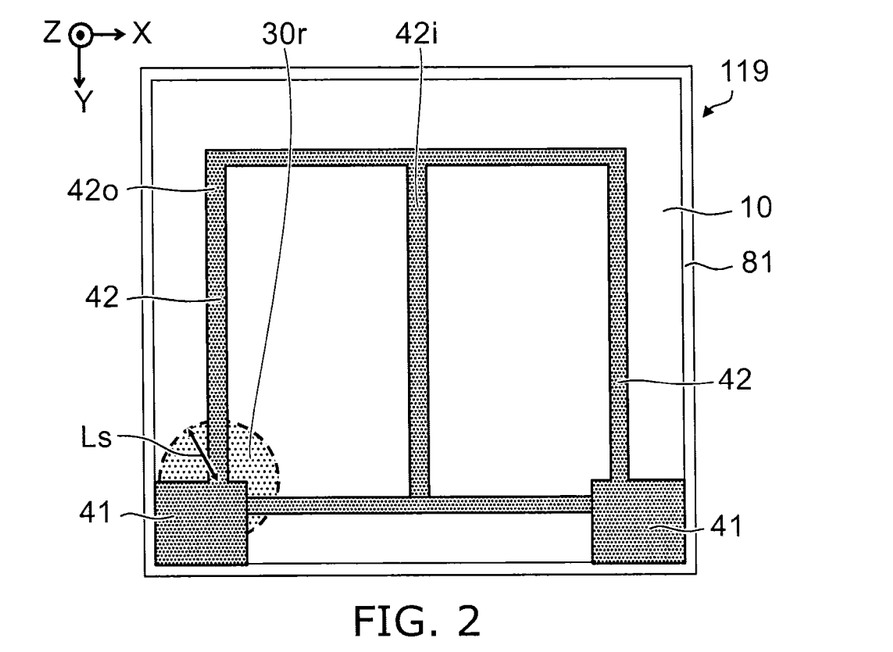
FIG. 2 is a schematic plan view showing the configuration of a semiconductor light emitting device of a reference example.

FIG. 2 is a schematic plan view illustrating the configuration of a semiconductor light emitting device of a reference example.

As shown in FIG. 2, in the semiconductor light emitting device 119 of the reference example, the first insulating layer 45 in the semiconductor light emitting device 110 is provided between the bonding pad 41 and the first semiconductor layer 10, but not provided between the narrow wire electrode 42 and the first semiconductor layer 10. Thus, the current concentrates on the boundary between the bonding pad 41 and the narrow wire electrode 42 and is injected into the first semiconductor layer 10. This current spreads in a certain range, and the light emitting region 30r overlaps the bonding pad 41. Thus, a large proportion of light emission is incident on the bonding pad 41 and causes loss. Accordingly, the semiconductor light emitting device 119 has low light extraction efficiency. Thus, even if an insulating layer is placed between the bonding pad 41 and the first semiconductor layer 10 to suppress light emission immediately below the bonding pad 41, the current spreads and is injected into a portion (second portion 42b) of the narrow wire electrode 42 near the bonding pad 41. Light emission by this current cannot be efficiently extracted.

In contrast, in the semiconductor light emitting device 110, the current injection is suppressed not only in the region corresponding to the bonding pad 41, but also in the region corresponding to the second portion 42b near the bonding pad 41. That is, in consideration of the light emitting region 30r based on current spreading, the injection position of the current is controlled. The current is injected from a position spaced by a certain distance or more from the bonding pad 41. The current injected into this region reaches the light emitting layer 30 while spreading, and forms a light emitting region 30r having a prescribed area. However, the light emitting region 30r is spaced from the bonding pad 41. Thus, light emission is not substantially incident on the bonding pad 41. This suppresses loss and achieves high light extraction efficiency.

That is, the injection point of the current injected from the narrow wire electrode 42 toward the first semiconductor layer 10 is distanced from the bonding pad 41. This suppresses loss and achieves high light extraction efficiency.

For instance, as shown in FIG. 1A and FIG. 1B, the distance Lb (μm) between the bonding pad 41 and the end 45e of the first insulating layer 45 on the opposite side from the bonding pad 41 is set larger than or equal to the spreading length Ls of the injected current. The emission light is not substantially incident on the bonding pad 41. Thus, the loss can be suppressed. Examples of the current spreading length Ls will be described later.

In the semiconductor light emitting device 110, the current concentration can be suppressed. This can suppress the characteristics degradation due to heat generation at the time of large current, and the decrease of internal quantum efficiency at the time of high current density (droop phenomenon). Thus, the reliability can be improved, and the optical output can also be increased.

The semiconductor light emitting device 110 further includes a second electrode 51, a metal layer 52, a bonding layer 53, a support substrate 54, and a rear surface electrode 55.

The second electrode 51 is electrically connected to the second semiconductor layer 20. The first semiconductor layer 10 is placed between the second electrode 51 and the narrow wire electrode 42, and between the second electrode 51 and the bonding pad 41. The light emitting layer 30 is placed between the second electrode 51 and the first semiconductor layer 10. The second semiconductor layer 20 is placed between the second electrode 51 and the light emitting layer 30.

The support substrate 54 is placed between the rear surface electrode 55 and the second electrode 51. The bonding layer 53 is placed between the support substrate 54 and the second electrode 51. The metal layer 52 is placed between the bonding layer 53 and the second electrode 51. The light emitting layer 30 is placed between the support substrate 54 and at least part of the first semiconductor layer 10. The second semiconductor layer 20 is placed between the light emitting layer 30 and the support substrate 54. The support substrate 54 is e.g. a conductive silicon substrate.

The second electrode 51 is reflective to the light emitted from the light emitting layer 30. The second electrode 51 is made of an Ag/Pt stacked film. The Ag film is in contact with the second semiconductor layer 20. The Pt film is placed on the Ag film. The thickness of the Ag/Pt stacked film is e.g. approximately 200 nm (e.g., 100 nm or more and 350 nm or less).

The light emission emitted from the light emitting layer 30 is emitted out primarily from the upper surface (being the opposite surface 10b and the surface 10q). That is, in the light emitted from the light emitting layer 30, the proportion of the light passing through the first semiconductor layer 10 and emitted outside is larger than the proportion of the light passing through the second semiconductor layer 20 and emitted outside. The light emission is reflected by the light reflective second electrode 51 and emitted out from the upper surface with high efficiency.

In the semiconductor light emitting device 110, the first insulating layer 45 is transmissive to the light emitted from the light emitting layer 30. Thus, the light emission passes through the first insulating layer 45 and is efficiently emitted out from the upper surface.

The semiconductor light emitting device 110 further includes a first dielectric layer 81 covering the side surface of the first semiconductor layer 10, the side surface of the light emitting layer 30, and the side surface of the second semiconductor layer 20. The semiconductor light emitting device 110 can further include a second dielectric layer 82 provided between the outer edge of the second semiconductor layer 20 and the metal layer 52. The first dielectric layer 81 and the second dielectric layer 82 are made of e.g. $SiO_2$. The first dielectric layer 81 and the second dielectric layer 82 function as protective layers. The first dielectric layer 81 and the second dielectric layer 82 can suppress degradation in the semiconductor layers and achieve high reliability.

In the semiconductor light emitting device 110, the first semiconductor layer 10 includes an unevenness portion 10d. The unevenness portion 10d is provided at the surface (opposite surface 10b) of the first semiconductor layer 10 on the opposite side from the surface (opposed surface 10a) opposed to the light emitting layer 30. The size of the unevenness portion 10d (the distance between the nearest protrusions of a plurality of protrusions included in the unevenness portion 10d) is e.g. half or more and 30 times or less of the peak wavelength of the light emitted from the light emitting layer 30 (the peak wavelength in the first semiconductor layer 10). The unevenness portion 10d thus provided increases the efficiency of light extraction from the opposite surface 10b.

In the following, an example configuration of the semiconductor light emitting device 110 is described while describing an example method for manufacturing the semiconductor light emitting device 110.

First, on a growth substrate, for instance, a buffer layer is formed. The buffer layer is made of e.g. a low temperature growth $Al_xGa_{1-x}N$ ($0 \leq x \leq 1$) thin film. On the buffer layer, a first semiconductor layer 10, a light emitting layer 30, and a second semiconductor layer 20 are crystal grown sequentially in this order. Thus, a stacked structure body including the first semiconductor layer 10, the light emitting layer 30, and the second semiconductor layer 20 is formed. The growth substrate is e.g. a sapphire substrate, silicon substrate, GaN substrate, SiC substrate, or GaAs substrate. The growth substrate is arbitrary. In the following, an example of using sapphire for the growth substrate is described.

As a second dielectric layer 82, for instance, a $SiO_2$ film (having a thickness of approximately 400 nm, e.g., 200 nm or more and 600 nm or less) is formed so as to cover the second semiconductor layer 20.

Part of this $SiO_2$ film is removed to expose the surface of the second semiconductor layer 20. On the exposed surface of the second semiconductor layer 20, as a second electrode 51, an Ag/Pt stacked film (having a thickness of 200 nm, e.g., 100 nm or more and 350 nm or less) is formed. Then, sintering treatment is performed in an oxygen atmosphere at approximately 400° C. (e.g., 350° C. or more and 500° C. or less) for 1 minute. The second electrode 51 forms ohmic contact with the second semiconductor layer 20. The Ag/Pt stacked film is processed into a prescribed shape before or after the sintering treatment. Thus, the second electrode 51 is formed.

On the second electrode 51 and on the aforementioned $SiO_2$ film, as a metal layer 52, for instance, a Ti/Pt/Au stacked film (having a thickness of approximately 800 nm, e.g., 600 nm or more and 1000 nm or less) is formed.

On the other hand, a support substrate 54 (e.g., silicon substrate) is prepared. On the major surface of the support substrate 54, a bonding layer 53 is provided. As the bonding layer 53, for instance, a solder layer of AuSn alloy (having a thickness of 3 micrometers (μm), e.g., 0.5 μm or more and 6 μm or less) is provided.

The metal layer 52 and the bonding layer 53 are opposed to and brought into contact with each other, and subjected to heating treatment. The heating temperature is a temperature higher than or equal to the eutectic point of the solder, such as 300° C. (e.g., 280° C. or more and 350° C. or less). Thus, the support substrate 54 is bonded to the stacked structure body via the bonding layer 53, the metal layer 52, and the second electrode 51. In the specification, the state of being bonded includes not only the state of two structure bodies being directly bonded to each other, but also the state of another element interposed therebetween.

From the growth substrate side, the stacked structure body is irradiated with e.g. third harmonic (355 nm) or fourth harmonic (266 nm) laser light of YVO$_4$ solid-state laser. Thus, for instance, at least part of GaN of the buffer layer is decomposed. Then, the decomposed Ga is removed by e.g. hydrochloric acid treatment. Thus, the growth substrate is stripped from the stacked structure body. Accordingly, the growth substrate and the stacked structure body are separated.

As described below, formation of a device isolation trench in the exposed stacked structure body, formation of an unevenness portion 10*d*, and formation of a first electrode (narrow wire electrode) are performed.

First, dry etching is performed entirely on the stacked structure body. The buffer layer and the like are removed, and the first semiconductor layer 10 is exposed. In this example, the etching amount is adjusted so that the total of the thickness of the second semiconductor layer 20, the thickness of the light emitting layer 30, and the thickness of the first semiconductor layer 10 becomes e.g. approximately 4 µm. The embodiment is not limited thereto. The thickness of the first semiconductor layer 10 may be 0.5 µm or more and 6 µm or less. At less than 0.5 µm, the current spreading length Ls is shortened, and the light emitting region 30*r* is narrowed. Thus, the effective current density is made higher. This promotes the decrease of internal quantum efficiency and the degradation of the semiconductor layers. At more than 6 µm, the growth time of the crystal layer is prolonged, and the crystal layer becomes prone to cracks. This decreases the productivity and yield.

Then, part of the stacked structure body is removed by dry etching using a resist mask or dielectric mask. Thus, part of the SiO$_2$ film (second dielectric layer 82) in contact with the stacked structure body is exposed. Next, on the stacked structure body and the exposed SiO$_2$ film, as a first dielectric layer 81, for instance, a SiO$_2$ film is formed. The thickness of the SiO$_2$ film constituting the first dielectric layer 81 is e.g. approximately 600 nm (e.g., 200 nm or more and 800 nm or less). The SiO$_2$ film constituting the first dielectric layer 81 is formed in a prescribed shape. The SiO$_2$ film constituting the first dielectric layer 81 is provided with an opening. Through the opening, the surface of the first semiconductor layer 10 is exposed.

The surface of the first semiconductor layer 10 exposed through the SiO$_2$ film constituting the first dielectric layer 81 is processed by e.g. alkali etching with KOH solution. Thus, an unevenness portion 10*d* is formed at the surface. The etching condition is such that, for instance, a 1 mol/L KOH solution is used, and for a processing temperature of 80° C., the processing time is approximately 20 minutes.

Next, on the SiO$_2$ film constituting the first dielectric layer 81 and the first semiconductor layer 10, a metal film is formed. This metal film is provided in a prescribed shape. Thus, the metal film constitutes a bonding pad 41 and a narrow wire electrode 42. The metal film is e.g. an Al/Ni/Au stacked film. The thickness of the metal film is e.g. approximately 3000 nm (e.g., 500 nm or more and 10000 nm or less).

The bonding pad 41 is shaped like e.g. a rectangle 100 µm on a side. The bonding pad 41 may be shaped like a circle having a diameter of 100 µm, or a combination of a circle and a rectangle. The width of the narrow wire electrode is e.g. approximately 10 µm (e.g., 5 µm or more and 15 µm or less). For instance, the width w42 (see FIG. 1B) of the narrow wire electrode 42 along the direction (in this example, the X-axis direction) perpendicular to the direction (in this example, the Y-axis direction) from the bonding pad 41 toward the first portion 42*a* is half or less of the distance Lb.

To the bonding pad 41, a bonding wire is connected.

The support substrate 54 is thinned to a thickness of approximately 100 µm (e.g., 50 µm or more and 200 µm or less) by e.g. grinding. On the ground surface, as a rear surface electrode 55, for instance, a Ti/Pt/Au stacked film (having a thickness of approximately 800 nm, e.g., 500 nm or more and 1300 nm or less) is formed. This rear surface electrode 55 is connected to e.g. a heat sink or package.

Then, as necessary, the support substrate 54 is cut by e.g. cleavage or a diamond blade. Thus, the semiconductor light emitting device 110 is completed.

An example of the current spreading length Ls in the first semiconductor layer 10 is described.

When a current is injected from one point of the first semiconductor layer 10, the current spreads in the X-Y plane in the first semiconductor layer 10 before reaching the light emitting layer 30. As viewed in the Z-axis direction, the current spreading is assumed to be circular about the injection point. The current spreading length Ls corresponds to its radius. The current spreading length Ls (µm) is expressed by the following equation (1).

$$Ls = ((n_{ideal} \cdot kT/(\rho \cdot e)) \times (t/J))^{1/2} \quad (1)$$

Here, t is the thickness (µm) of the current spreading layer. J is the current density (ampere/cm$^2$). T is the temperature (K, Kelvin). $n_{ideal}$ is the ideal factor of the diode. For $n_{ideal}$, for instance, 1.5 is used. ρ is the resistivity (Ωcm) of the current spreading layer. k is the Boltzmann constant (Joule·Kelvin$^{-1}$), approximately 1.38×10$^{-23}$. e is the elementary electric charge, approximately 1.60×10$^{-19}$ (Coulomb).

In the case of the semiconductor light emitting device 110, the resistivity of the p-type semiconductor layer is 100 to 1000 times higher than the resistivity of the n-type semiconductor layer. Thus, the current spreading layer may be considered as substantially the n-type semiconductor layer (first semiconductor layer 10). Accordingly, t corresponds to the thickness t10 of the first semiconductor layer 10.

In the experiment conducted by the inventor, samples were fabricated with the thickness t10 of the first semiconductor layer 10 (thickness t) varied. The sample with the thickness t10 (thickness t) set to 1 µm is referred to as first sample SP01. The sample with the thickness t10 (thickness t) set to 2.5 µm is referred to as second sample SP02. The chip size of these samples is 1 mm×1 mm. The area of the pn junction region is 0.95 mm×0.95 mm.

Figure 3:
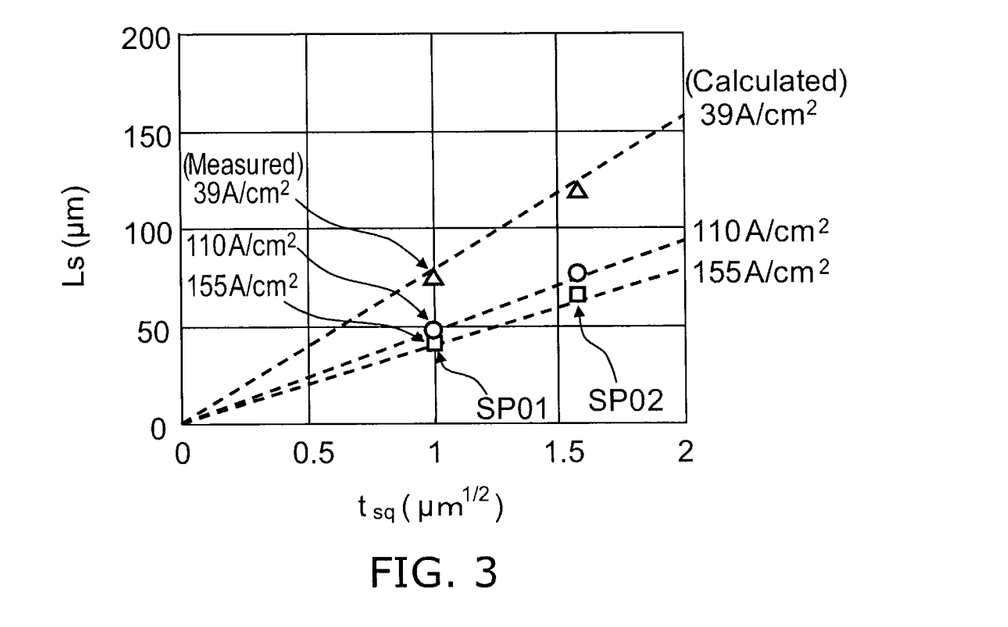
FIG. 3 is a graph showing the characteristics of the semiconductor light emitting device.

FIG. 3 is a graph illustrating the characteristics of the semiconductor light emitting device.

FIG. 3 shows a result of measuring the current spreading length Ls in the first sample SP01 and the second sample SP02. The horizontal axis represents the square root $t_{sq}$ (µm$^{1/2}$) of the thickness t10 of the first semiconductor layer 10 (thickness t). The vertical axis represents the current spreading length Ls. In this experiment, at each current density, the current spreading length Ls was determined from the fitting based on the following equation (2).

$$P(x) = 2P0/((x/Ls + 2^{1/2})^2) \quad (2)$$

With the end of the narrow wire electrode 42 placed at the origin, the distance x (µm) away from the narrow wire electrode 42 is taken in the direction perpendicular to the extending direction of the narrow wire electrode 42 (e.g., if the extending direction of the narrow wire electrode 42 is the Y-axis direction, the direction perpendicular thereto is the X-axis direction). The optical output at the origin is denoted by P0. The optical output at the distance x is denoted by P(x), normalized so that P0=1.

FIG. 3 shows the characteristics for a current density J of 39 A/cm² (triangle), the characteristics for 110 A/cm² (circle), and the characteristics for 155 A/cm² (square). Furthermore, in FIG. 3, the current spreading length Ls calculated using equation (1) is indicated by dashed lines. In this calculation, $n_{ideal}$ is set to 1.5, T is set to 373 K, and ρ is set to 0.002 Ωcm.

As seen from FIG. 3, it was found that the current spreading length Ls for the first sample SP01 and the second sample SP02 is in good agreement with the calculated values (dashed lines). It was found that for a constant current density J, the current spreading length Ls is nearly proportional to the square root $t_{sq}$ of the thickness t of the current spreading layer. This is presumably because the temperature T and the resistivity ρ of the current spreading layer have small variations with respect to the variation in the current density J and the thickness t.

In fact, the temperature T only varies by several ten percent. ρ is determined primarily by the crystal quality and the impurity doping concentration. However, attempts to minimize the resistivity for the same material result in substantially similar values. Thus, the resistivity can be regarded constant.

It is considered that in view of the influence of heat generation, the current density J supplied to one semiconductor light emitting device has an upper limit of 155 A/cm² (e.g., corresponding to approximately 1.4 A for a chip size of 1 mm×1 mm). Furthermore in the typical operation, the current density J is 39 A/cm² (e.g., corresponding to approximately 350 mA for a chip size of 1 mm×1 mm).

The current spreading length Ls at a current density J of 155 A/cm² is approximately 39 times the square root $t_{sq}$ of the thickness t of the current spreading layer (thickness t10 of the first semiconductor layer 10). The current spreading length Ls at a current density J of 39 A/cm² is approximately 79 times the square root $t_{sq}$ of the thickness t of the current spreading layer (thickness t10 of the first semiconductor layer 10).

Thus, for a current density J of 155 A/cm², the distance Lb between the bonding pad 41 and the end 45e of the first insulating layer 45 on the opposite side from the bonding pad 41 is set to approximately 35 times or more of the square root $t_{sq}$ of the thickness t10 of the first semiconductor layer 10. This can substantially prevent the light emitting region 30r from overlapping the bonding pad 41. More preferably, the distance Lb is 40 times or more of the square root $t_{sq}$ of the thickness t10 of the first semiconductor layer 10. This can further distance the light emitting region 30r from the bonding pad 41 and stably achieve even higher light extraction efficiency.

For a current density J of 39 A/cm², the distance Lb is set to approximately 70 times or more of the square root $t_{sq}$ of the thickness t10 of the first semiconductor layer 10. This can substantially prevent the light emitting region 30r from overlapping the bonding pad 41. More preferably, the distance Lb is 80 times or more of the square root $t_{sq}$ of the thickness t10 of the first semiconductor layer 10. This can further distance the light emitting region 30r from the bonding pad 41 and stably achieve even higher light extraction efficiency.

If the distance Lb is longer than or equal to the current spreading length Ls, the effect of increasing the light extraction efficiency by lengthening the distance Lb is saturated. If the distance Lb is excessively long, the length of the first portion 42a of the narrow wire electrode 42 is excessively shortened. This decreases the ohmic contact region between the narrow wire electrode 42 and the first semiconductor layer 10, and tends to increase the operating voltage. Thus, preferably, the distance Lb is not excessively long.

From this viewpoint, for a current density J of 155 A/cm², the distance Lb is preferably 35 times or more and 140 times or less of the square root $t_{sq}$ of the thickness t10 of the first semiconductor layer 10. For a current density J of 39 A/cm², the distance Lb is preferably 70 times or more and 280 times or less of the square root $t_{sq}$ of the thickness t10 of the first semiconductor layer 10.

In the example shown in FIG. 1B, for instance, the distance Lb is preferably half or less of the length La of the narrow wire electrode 42 along the direction from the bonding pad 41 toward the first portion 42a (in this example, the Y-axis direction). If the distance Lb exceeds the length La, for instance, the operating voltage becomes excessively high.

As described above, in the above experiment, the spreading length of light emission intensity is used as the current spreading length Ls. That is, the current spreading length Ls is determined assuming that the light emission intensity does not depend on the current density. In fact, due to the droop phenomenon, the internal quantum efficiency changes depending on the current density. Thus, the light emission efficiency depends on the current density. However, as described with reference to FIG. 3, the measured values of the current spreading length Ls are in good agreement with the calculated values. This demonstrates that this assumption is valid.

In the embodiment, the location where carriers (electrons) injected from the narrow wire electrode 42 are injected into the light emitting layer 30 at the highest density is spaced by a certain distance from the bonding pad 41. This distance is a distance such that, for instance, the light emission intensity sufficiently decreases (i.e., decreases by a factor of the inverse of the Napier number e). In the embodiment, the location where the injected carriers are injected into the light emitting layer 30 at the highest density corresponds to the boundary portion between the first portion 42a and the second portion 42b.

In the embodiment, the thickness t10 of the first semiconductor layer 10 is assumed to be the average thickness of the first semiconductor layer 10. For instance, in the case where an unevenness portion 10d is provided at the opposite surface 10b (upper surface) of the first semiconductor layer 10, the average thickness t10 of the first semiconductor layer 10 is the distance between the opposed surface 10a and the position (the position along the Z-axis direction) of half the depth of the unevenness portion 10d.

Second Embodiment

Figure 4A:
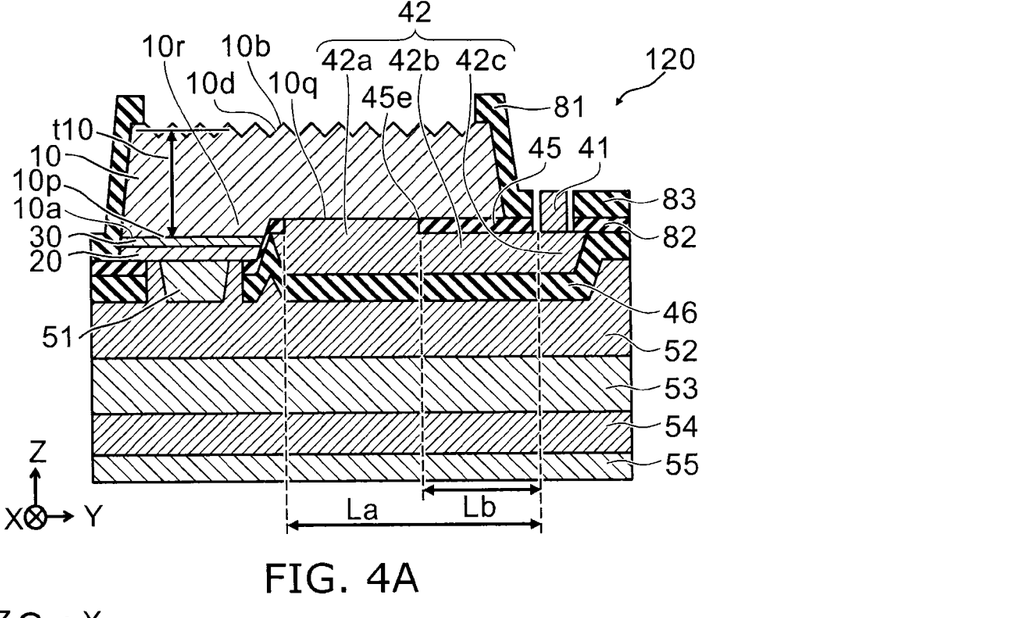
FIG. 4A and FIG. 4B are schematic views showing the configuration of a semiconductor light emitting device according to a second embodiment.
Figure 4B:
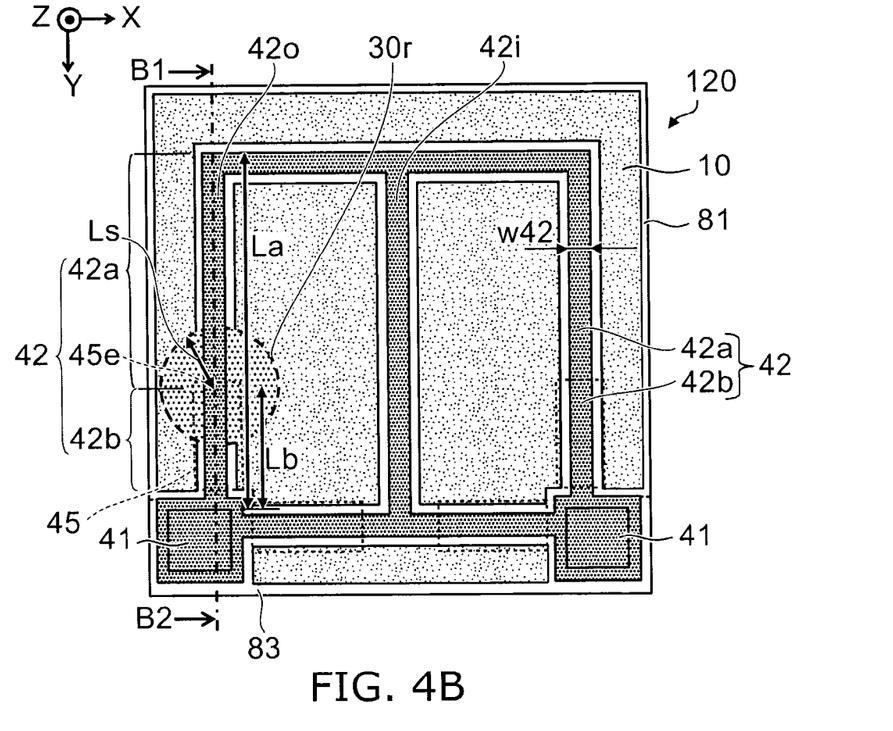

FIG. 4A and FIG. 4B are schematic views illustrating the configuration of a semiconductor light emitting device according to a second embodiment.

FIG. 4A is a sectional view taken along line B1-B2 of FIG. 4B. FIG. 4B is a transparent plan view.

As shown in FIG. 4A and FIG. 4B, the semiconductor light emitting device 120 according to the embodiment includes a first semiconductor layer 10, a second semiconductor layer 20, a light emitting layer 30, a bonding pad 41, a narrow wire electrode 42, and a first insulating layer 45.

The first semiconductor layer 10 is of the first conductivity type (e.g., n-type). The second semiconductor layer 20 is of the second conductivity type (e.g., p-type). The light emitting layer 30 is provided between the first semiconductor layer 10 and the second semiconductor layer 20. The light emitting layer 30 is in contact with the first semiconductor layer 10. In the semiconductor light emitting device 120, part of the lower surface of the first semiconductor layer 10 is in contact with the light emitting layer 30.

The narrow wire electrode 42 is provided on the surface 10q of the first semiconductor layer 10 not in contact with the light emitting layer 30. The surface 10q is the lower surface of the first semiconductor layer 10.

The semiconductor light emitting device 120 further includes a metal layer 52, a second electrode 51, and a second insulating layer 46. In addition to the first portion 42a and the second portion 42b, the narrow wire electrode 42 further includes a third portion 42c. For instance, the third portion 42c does not overlap the first semiconductor layer 10 as projected on the X-Y plane (the plane parallel to the surface 10q).

The second electrode 51 is provided on part of the metal layer 52, and electrically connected to the metal layer 52. The second insulating layer 46 is provided on another part (the portion not provided with the second electrode 51) of the metal layer 52. The second insulating layer 46 is made of e.g. $SiO_2$.

The support substrate 54 includes an edge portion outside the first semiconductor layer 10 as viewed in the Z-axis direction. The bonding pad 41 is provided on the edge portion. The bonding pad 41 is placed on the third portion 42c of the narrow wire electrode 42.

The second semiconductor layer 20 is placed on the second electrode 51. The light emitting layer 30 is placed on the second semiconductor layer 20. Part of the first semiconductor layer 10 is placed on the light emitting layer 30. The narrow wire electrode 42 is placed on the second insulating layer 46. As described above, the bonding pad 41 is placed on the third portion 42c of the narrow wire electrode 42. The first insulating layer 45 is placed on the second portion 42b of the narrow wire electrode 42. The first semiconductor layer 10 is placed on the first portion 42a, on the first insulating layer 45, and on the light emitting layer 30. Also in this case, in the third portion 42c, the narrow wire electrode 42 is electrically connected to the bonding pad 41. The light emitting layer 30 is placed between the support substrate 54 and part 10r of the first semiconductor layer 10. The second semiconductor layer 20 is placed between the light emitting layer 30 and the support substrate 54.

The first semiconductor layer 10 has an opposed surface 10a (lower surface) opposed to the light emitting layer 30, and an opposite surface 10b (upper surface) on the opposite side from the opposed surface 10a. The opposed surface 10a is a surface 10p of the first semiconductor layer 10 in contact with the light emitting layer 30. In this example, part of the first semiconductor layer 10 is in contact with the light emitting layer 30. Thus, there are two surfaces 10q of the first semiconductor layer 10 not in contact with the light emitting layer 30, i.e., on the lower surface side and the upper surface side of the first semiconductor layer 10. On the lower surface side thereof, the narrow wire electrode 42 is provided.

In this example, as projected on the X-Y plane, the bonding pad 41 does not overlap the first semiconductor layer 10, the second semiconductor layer 20, and the light emitting layer 30.

Also in the semiconductor light emitting device 120, the narrow wire electrode 42 is juxtaposed with the bonding pad 41 in a plane parallel to the surface 10q (in this example, the lower surface) of the first semiconductor layer 10 not in contact with the light emitting layer 30. The narrow wire electrode 42 is electrically connected to the bonding pad 41.

The narrow wire electrode 42 includes a first portion 42a in ohmic contact with the first semiconductor layer 10, and a second portion 42b provided between the first portion 42a and the bonding pad 41.

The first insulating layer 45 is provided between the second portion 42b and the first semiconductor layer 10.

Also in the embodiment, in consideration of the current spreading, the light emitting region 30r is spaced from the bonding pad 41 to reduce loss. This achieves high light extraction efficiency.

For instance, the distance Lb (μm) between the bonding pad 41 and the end 45e of the first insulating layer 45 on the opposite side from the bonding pad 41 is set to 35 times or more of the square root $t_{sq}$ of the thickness t10 (μm) of the first semiconductor layer 10 in the case of current density J of 155 A/cm². This achieves high light extraction efficiency.

The distance Lb is e.g. 35 times or more and 140 times or less of the square root $t_{sq}$. The distance Lb is e.g. 70 times or more and 280 times or less of the square root $t_{sq}$ in the case of current density J of 39 A/cm². The distance Lb is e.g. half or less of the length of the narrow wire electrode 42 along the direction from the bonding pad 41 toward the first portion 42a.

Also in the semiconductor light emitting device 120, the second electrode 51 is reflective to the light emitted from the light emitting layer 30. The second electrode 51 is made of an Ag/Pt stacked film. The Ag film is in contact with the second semiconductor layer 20. The Pt film is placed on the Ag film. The thickness of the Ag/Pt stacked film is e.g. approximately 200 nm (e.g., 100 nm or more and 350 nm or less).

The light emission emitted from the light emitting layer 30 is emitted out primarily from the upper surface (opposite surface 10b). That is, in the light emitted from the light emitting layer 30, the proportion of the light passing through the first semiconductor layer 10 and emitted outside is larger than the proportion of the light passing through the second semiconductor layer 20 and emitted outside. The light emission is reflected by the light reflective second electrode 51 and emitted out from the upper surface with high efficiency.

Also in this example, the first semiconductor layer 10 includes an unevenness portion 10d provided at the surface (opposite surface 10b) of the first semiconductor layer 10 on the opposite side from the surface (opposed surface 10a) opposed to the light emitting layer 30. This further increases the light extraction efficiency.

Also in the semiconductor light emitting device 120, for instance, the width w42 of the narrow wire electrode 42 along the direction (in this example, the X-axis direction) perpendicular to the direction (in this example, the Y-axis direction) from the bonding pad 41 toward the first portion 42a is half or less of the distance Lb.

Also in the semiconductor light emitting device 120, a first dielectric layer 81 is provided so as to cover the side surface of the first semiconductor layer 10, the side surface of the second semiconductor layer 20, and the side surface of the light emitting layer 30. A second dielectric layer 82 and a third dielectric layer 83 are provided around the bonding pad 41.

In the semiconductor light emitting device 120, no electrodes (such as the narrow wire electrode 42 and the second electrode 51) are provided on the upper surface (opposite surface 10b). Hence, compared with the case where electrodes are placed on the upper surface, the light extraction efficiency at the upper surface is increased.

Furthermore, the second electrode 51 immediately below the light emitting layer 30 constituting a main heat generation source is connected to the metal layer 52 and the support substrate 54 having high thermal conductivity. For instance, a heat sink can be connected to the support substrate 54. This can decrease the heat resistance and achieve good heat dissipation. In addition, the metal layer 52 has a large area substantially equal to that of the support substrate 54. This improves heat spreading and can further decrease the heat resistance.

Figure 5:
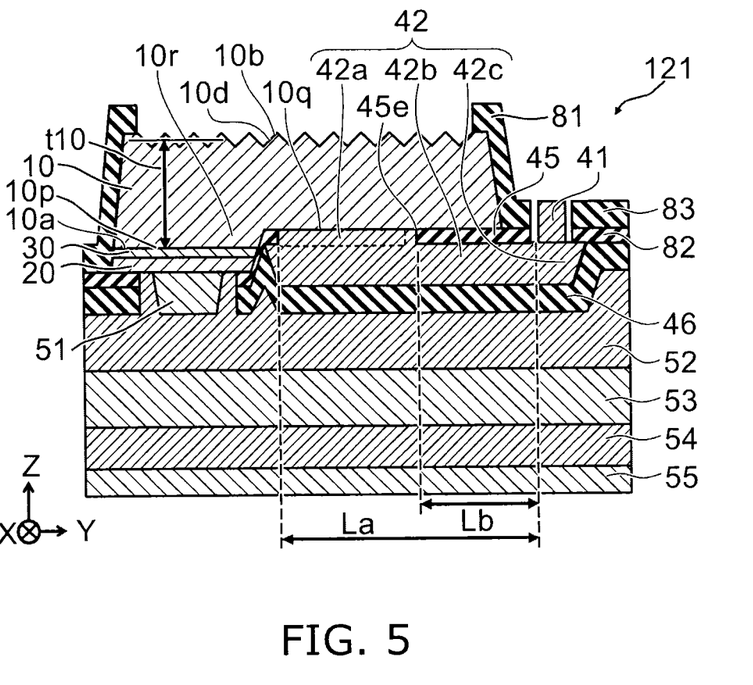
FIG. 5 is a schematic sectional view illustrating the configuration of an alternative semiconductor light emitting device according to the second embodiment.

FIG. 5 is a schematic sectional view illustrating the configuration of an alternative semiconductor light emitting device according to the second embodiment.

As shown in FIG. 5, in the alternative semiconductor light emitting device 121 according to the embodiment, the first portion 42a of the narrow wire electrode 42 is spaced from the first insulating layer 45. The rest is similar to the semiconductor light emitting device 120. In the semiconductor light emitting device 121, the first portion 42a in ohmic contact with the first semiconductor layer 10 is provided independently of the pattern of the first insulating layer 45. The semiconductor light emitting device 121 can also provide a semiconductor light emitting device having high light extraction efficiency.

As an example of the semiconductor light emitting device 120 according to the embodiment, an LED having a chip size of 1 mm×1 mm was fabricated. The width w42 of the narrow wire electrode 42 is approximately 10 μm. The distance Lb is approximately 100 μm. The thickness of the first semiconductor layer 10 is approximately 2.5 μm. Furthermore, as a reference example, another semiconductor light emitting device was fabricated. This semiconductor light emitting device is different in configuration from the semiconductor light emitting device 120 in that the first insulating layer 45 is not provided between the narrow wire electrode 42 and the first semiconductor layer 10.

The light emission characteristics of these semiconductor light emitting devices were evaluated. Then, for an operating current of 350 mA, the optical output of the semiconductor light emitting device 120 was approximately 3% higher than the semiconductor light emitting device of the reference example. The operating voltage was substantially equal.

In the semiconductor light emitting device 120, the first insulating layer 45 is provided. Thus, the contact area between the narrow wire electrode 42 and the first semiconductor layer 10 is made smaller than in the case where the first insulating layer 45 is not provided. This may raise concern about the increase of the operating voltage. It is natural to anticipate that the operating voltage is increased by forming an insulating layer between the narrow wire electrode 42 and the first semiconductor layer 10. This anticipation generally negates the idea of introducing the first insulating layer 45. Thus, in order to restrict the current injection region and to distance the light emitting region from the bonding pad 41, it may be considered to adopt another approach for forming a non-ohmic contact region on the second semiconductor layer 20 side. However, this approach increases the number of process steps. Furthermore, in this approach, it is difficult to accurately control the current injection region.

Before performing the experiment, the inventor also anticipated that the operating voltage would be increased by forming an insulating layer between the narrow wire electrode 42 and the first semiconductor layer 10. However, as described above, there was actually no substantial change in the operating voltage. The contact resistance between the first semiconductor layer 10 (n-type semiconductor layer) and the narrow wire electrode 42 is sufficiently low. Thus, it is considered that even if the contact area decreases to some extent, there is no significant influence on the resulting operating voltage.

In the first and second embodiments, the support substrate 54 includes at least a conductive portion. For instance, the support substrate 54 is a semiconductor substrate made of e.g. Si or Ge, a metal plate made of e.g. CuW or Cu, or a thick film plating layer. Alternatively, the support substrate 54 may be a substrate including an insulating substrate (such as resin substrate) and a conductive layer (such as metal wiring) formed inside the insulating substrate or formed on the insulating substrate.

The semiconductor light emitting device according to the first and second embodiments includes at least an n-type semiconductor layer, a p-type semiconductor layer, and a semiconductor layer including a light emitting layer sandwiched therebetween. The method for forming these semiconductor layers can be based on e.g. metal organic vapor phase epitaxy or molecular beam epitaxy. However, the forming method is not limited.

The second electrode 51 contains at least silver or an alloy thereof. The reflection efficiency for the visible band of a monolayer film of a metal other than silver tends to decrease as the wavelength becomes shorter in the ultraviolet range of 400 nm or less. Silver has high reflection efficiency characteristics even for light in the ultraviolet band of 370 nm or more and 400 nm or less. In an ultraviolet emitting semiconductor light emitting device, in the case where the second electrode 51 contains a silver alloy, the component ratio of silver in the vicinity of the semiconductor layer interface side of the second electrode 51 is preferably high. The thickness of the second electrode 51 is preferably 100 nm or more. This can ensure e.g. high light reflection efficiency.

When the crystal layer on the sapphire substrate (crystal growth substrate) is bonded to the support substrate 54, and when GaN is decomposed by laser light to strip the sapphire substrate, the crystal layer is prone to crystal defects and damage. This is attributed to e.g. the thermal expansion coefficient difference between the support substrate 54 and sapphire and between the support substrate 54 and GaN, heat due to local heating, and products generated by the decomposition of GaN. If crystal defects and damage occur in the crystal layer, then at the site of occurrence, Ag of the second electrode 51 diffuses into the crystal layer and increases leaks and crystal defects inside the crystal layer in an accelerated manner.

In the first and second embodiments, a monocrystalline AlN buffer layer, for example, may be used as the buffer layer. Thus, a high quality semiconductor layer can be formed. This significantly reduces damage to the crystal. Furthermore, when GaN is decomposed by laser light, heat diffuses into the AlN buffer layer exhibiting high thermal conductivity characteristics adjacent to GaN. Thus, thermal damage due to local heating is less likely to occur.

The semiconductor light emitting device according to the first and second embodiments may further include e.g. a GaN buffer layer formed at the time of forming the first semiconductor layer 10 on the crystal growth substrate. The unevenness portion 10d may be formed in the GaN buffer layer. In the n-type contact layer included in the first semiconductor layer 10, the carrier concentration (e.g., impurity concentration) is set to be high to form low resistance ohmic contact. If the unevenness portion 10d is formed in this n-type contact layer, surface roughening and impurity precipitation may occur. These cause the decrease of light extraction efficiency. On the other hand, the GaN buffer layer has a lower impurity concentration than the n-type contact layer. Thus, surface roughening and impurity precipitation are less likely to occur in the GaN buffer layer.

The unevenness portion 10d can be formed by e.g. wet etching or dry etching. In the case of using alkali etching with e.g. KOH solution, anisotropic etching occurs along the surface orientation of the GaN crystal, primarily {10-1-1}. As a result, a hexagonal pyramid structure is formed. The etching rate and the size and density of hexagonal pyramids greatly change with the etching temperature and time, pH (adjusted by adding other substances), concentration, and the presence or absence of UV light or UV laser irradiation. In general, as the etching amount (the depth from the surface before etching to the deepest position of the unevenness portion formed after etching) becomes larger, the unevenness portion 10d is formed more densely in a larger size.

In the case of forming the unevenness portion 10d by dry etching, unlike the Ga surface, the N surface is sensitive to the crystal orientation and dislocations, and easily subjected to anisotropic etching. The surface of GaN grown on a c-plane sapphire substrate is normally a Ga surface. The surface of GaN exposed by removing the sapphire substrate is an N surface. Thus, it is easy to form the unevenness portion 10d by anisotropic etching based on dry etching. Alternatively, the unevenness portion 10d may be formed by dry etching using a mask. In this method, the number of process steps is increased. However, the unevenness portion 10d can be formed as designed. This facilitates increasing the light extraction efficiency.

The unevenness portion 10d has the function of e.g. effectively extracting the incident emission light, or changing the incident angle. The size of the unevenness portion 10d is preferably larger than or equal to the light emission wavelength in the crystal layer. If the unevenness portion 10d is smaller than the light emission wavelength, the emission light incident on the unevenness portion 10d exhibits behaviors described by wave optics such as scattering and diffraction at the interface of the unevenness portion 10d. Thus, due to the unevenness portion 10d, part of the emission light fails to be extracted. Furthermore, the unevenness portion 10d sufficiently smaller than the light emission wavelength is regarded as a layer in which the refractive index continuously changes. This unevenness portion 10d is similar to a flat surface without unevenness, and the effect of improving the light extraction efficiency is decreased.

For instance, in the case where the peak wavelength of the light emission is 390 nm (the wavelength in the GaN crystal layer is approximately 155 nm), if the size of the unevenness portion 10d (the widest width in the planar shape of the protrusion) is 50 nm or more and less than 0.2 µm, the optical output sharply increases with the increase of the size. If the size of the unevenness portion 10d is 0.5 µm or more and 3 µm or less, the optical output gradually increases. For instance, the size of the unevenness portion 10d is preferably twice or more, and more preferably 10 times or more, of the light emission wavelength (peak wavelength) in the crystal layer.

The portion of the narrow wire electrode 42 in contact with the first semiconductor layer 10 is made of e.g. Al. This achieves good ohmic characteristics and low contact characteristics with respect to the first semiconductor layer. Furthermore, high reflectivity is achieved. Thus, the light extraction efficiency is increased. Furthermore, the design flexibility of the narrow wire electrode 42 is improved. Because Al has low environmental resistance, the narrow wire electrode 42 may be made of e.g. an Al alloy slightly containing Si. This can improve the reliability and adhesiveness. However, in the first and second embodiments, the configuration of the narrow wire electrode 42 is arbitrary.

The embodiments can provide a semiconductor light emitting device having high light extraction efficiency.

In the specification, the "nitride semiconductor" includes semiconductors of the chemical formula $B_x In_y Al_z Ga_{1-x-y-z} N$ ($0 \le x \le 1$, $0 \le y \le 1$, $0 \le z \le 1$, $x+y+z \le 1$) of any compositions with the composition ratios x, y, and z varied in the respective ranges. Furthermore, the "nitride semiconductor" also includes those of the above chemical formula further containing group V elements other than N (nitrogen), those further containing various elements added for controlling various material properties such as conductivity type, and those further containing various unintended elements.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiments of the invention have been described above with reference to examples. However, the invention is not limited to these examples. For instance, any specific configurations of various components such as the first semiconductor layer, second semiconductor layer, light emitting layer, bonding pad, narrow wire electrode, first insulating layer, second insulating layer, second electrode, bonding layer, support substrate, rear surface electrode, and dielectric layer included in the semiconductor light emitting device are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
    a first semiconductor layer of a first conductivity type;
    a second semiconductor layer of a second conductivity type;
    a light emitting layer provided between the first semiconductor layer and the second semiconductor layer and being in contact with a first surface of the first semiconductor layer;
    a bonding pad extending in a first direction;
    a narrow wire electrode including a first portion extending in the first direction and a second portion extending in the first direction, the first portion being provided on and in direct contact with a second surface of the first semiconductor layer, which is opposite to the first surface of the first semiconductor layer and which is not in contact with the light emitting layer, the second portion being provided on the second surface of the first semiconductor layer and located between the first portion and the bonding pad in the first direction, the narrow wire electrode being electrically connected to the bonding pad; and a first insulating layer provided between the second portion and the second surface of the first semiconductor layer, wherein a width of the second portion along a second direction, which is perpendicular to the first direction is smaller than a width of the bonding pad in the second direction, wherein a distance (in micrometers) along the first direction between the bonding pad and an end of the first insulating layer that is disposed between the bonding pad and the first portion is 35 times or more of square root of a thickness (in micrometers) of the first semiconductor layer, and wherein the distance is half or less of a length of the narrow wire electrode along the first direction.

2. The device according to claim 1, wherein a width of the narrow wire electrode along the second direction is half or less of the distance.

3. The device according to claim 1, wherein
the light emitting layer is placed between the narrow wire electrode and the second semiconductor layer,
the first semiconductor layer is placed between the narrow wire electrode and the light emitting layer,
the bonding pad is provided on the second surface of the first semiconductor layer, and
the first insulating layer is further provided between the bonding pad and the first semiconductor layer.

4. The device according to claim 3, further comprising:
a second electrode electrically connected to the second semiconductor layer,
the first semiconductor layer being placed between the second electrode and the narrow wire electrode and between the second electrode and the bonding pad,
the light emitting layer being placed between the second electrode and the first semiconductor layer, and
the second semiconductor layer being placed between the second electrode and the light emitting layer.

5. The device according to claim 4, wherein the second electrode is reflective to a light emitted from the light emitting layer.

6. The device according to claim 1, further comprising:
a support substrate electrically connected to the second semiconductor layer,
the light emitting layer being placed between the support substrate and at least a part of the first semiconductor layer, and
the second semiconductor layer being placed between the light emitting layer and the support substrate.

7. The device according to claim 6, wherein the support substrate is bonded to the second semiconductor layer.

8. The device according to claim 1, wherein in a light emitted from the light emitting layer, a proportion of the light passing through the first semiconductor layer and emitted outside is larger than a proportion of the light passing through the second semiconductor layer and emitted outside.

9. The device according to claim 1, wherein the first insulating layer is transmissive to a light emitted from the light emitting layer.

10. The device according to claim 1, wherein the first semiconductor layer has a thickness of 0.5 micrometers or more and 6 micrometers or less.

11. The device according to claim 1, wherein the narrow wire electrode includes Al.

12. The device according to claim 1, wherein the bonding pad includes Al.

13. The device according to claim 1, wherein the first semiconductor layer includes an unevenness portion provided at the second surface of the first semiconductor layer.

14. The device according to claim 1, wherein the narrow wire electrode includes an outer edge portion along an outer edge of the first semiconductor layer and an inside portion inside the outer edge portion.

15. The device according to claim 1, wherein
the first conductivity type is n-type, and
the second conductivity type is p-type.

16. The device according to claim 1, wherein the first semiconductor layer, the second semiconductor layer, and the light emitting layer include a nitride semiconductor.

* * * * *